United States Patent
Nakazawa et al.

(10) Patent No.: US 9,527,160 B2
(45) Date of Patent: Dec. 27, 2016

(54) LASER MACHINING DEVICE FOR USE IN PATTERNING

(71) Applicant: KAWASAKI JUKOGYO KABUSHIKI KAISHA, Kobe-shi, Hyogo (JP)

(72) Inventors: Mutsuhiro Nakazawa, Kobe (JP); Kazunori Takahara, Kobe (JP); Osami Oogushi, Kobe (JP)

(73) Assignee: KAWASAKI JUKOGYO KABUSHIKI KAISHA, Kobe-shi (JP)

( * ) Notice: Subject to any disclaimer, the term of this patent is extended or adjusted under 35 U.S.C. 154(b) by 319 days.

(21) Appl. No.: 14/389,123

(22) PCT Filed: Mar. 25, 2013

(86) PCT No.: PCT/JP2013/001991
§ 371 (c)(1),
(2) Date: Sep. 29, 2014

(87) PCT Pub. No.: WO2013/145682
PCT Pub. Date: Oct. 3, 2013

(65) Prior Publication Data
US 2015/0217403 A1 Aug. 6, 2015

(30) Foreign Application Priority Data
Mar. 27, 2012 (JP) .................................. 2012-072415

(51) Int. Cl.
*B23K 26/08* (2014.01)
*B23K 26/00* (2014.01)
(Continued)

(52) U.S. Cl.
CPC ....... *B23K 26/0892* (2013.01); *B23K 26/0087* (2013.01); *B23K 26/073* (2013.01);
(Continued)

(58) Field of Classification Search
CPC ..... B23K 26/00; B23K 26/08; B23K 26/0892; B23K 26/0087; B23K 26/0042; B23K 26/0083; H01L 31/18
(Continued)

(56) References Cited

U.S. PATENT DOCUMENTS 7,067,827 B2* 6/2006 Bol .................... A61L 2/087
141/85
7,473,866 B2* 1/2009 Morishige .......... B23K 26/0613
219/121.76

FOREIGN PATENT DOCUMENTS

JP    H03-275292 A    12/1991
JP    A-2004-170455   6/2004
(Continued)

OTHER PUBLICATIONS

Jan. 15, 2015 Office Action issued in Taiwanese Patent Application No. 102110804.
(Continued)

*Primary Examiner* — Samuel M Heinrich
(74) *Attorney, Agent, or Firm* — Oliff PLC

(57) ABSTRACT

A beam head unit including beam heads configured to scan a single laser beam on a thin-film layer of a workpiece from an irradiation start side toward an irradiation end side in a direction crossing a feeding direction of the workpiece while the workpiece is fed by a constant-speed feeder; laser oscillator configured to emit the laser beam to irradiate each beam head; a controller configured to control scanning speed of the laser beam emitted from each beam head and feeding speed of the workpiece to control a machining line formed in the workpiece fed at the predetermined feeding speed. The controller is configured to switch a beam head to use to form the machining line between the beam heads to form the machining line alternately. This configuration makes it pos-
(Continued)

sible to form machining lines highly efficiently in the thin-film layer of the workpiece while feeding the workpiece.

7 Claims, 9 Drawing Sheets

(51) Int. Cl.
B23K 26/073 (2006.01)
H01L 31/0463 (2014.01)
H01L 31/18 (2006.01)
B23K 26/40 (2014.01)

(52) U.S. Cl.
CPC ........ *B23K 26/083* (2013.01); *B23K 26/0838* (2013.01); *B23K 26/0869* (2013.01); *B23K 26/364* (2015.10); *B23K 26/40* (2013.01); *H01L 31/0463* (2014.12); *H01L 31/18* (2013.01); *B23K 2203/172* (2015.10); *B23K 2203/56* (2015.10); *Y02E 10/50* (2013.01)

(58) Field of Classification Search
USPC ....... 219/121.61, 121.68, 121.77; 250/492.2, 250/492.22
See application file for complete search history.

(56) References Cited

FOREIGN PATENT DOCUMENTS

| | | |
|---|---|---|
| JP | A-2010-221274 | 10/2010 |
| JP | 2011-000632 A | 1/2011 |
| JP | 2012-006077 A | 1/2012 |
| KR | 10-1015208 B1 | 2/2011 |
| TW | 200635688 A | 10/2006 |
| TW | 201006597 A | 2/2010 |
| WO | 2011/17571 A2 | 2/2011 |

OTHER PUBLICATIONS

Nov. 11, 2015 Office Action issued in Chinese Patent Application No. 201380008161.9.
Jun. 25, 2013 International Search Report issued in International Patent Application No. PCT/JP2013/001991.

\* cited by examiner

LASER MACHINING DEVICE FOR USE IN PATTERNING

TECHNICAL FIELD

The present invention relates to laser machining devices for use in patterning in the process of manufacturing, for example, thin-film solar cells or flexible solar cells.

BACKGROUND ART

Conventionally, there are solar cells for solar power generation, such as thin silicon solar cells and CIGS solar cells. (These types of solar cells are collectively referred to as "thin-film solar cells" in the description and claims herein.) Such a thin-film solar cell is formed in the following manner: forming a metal film, or a semiconducting material film such as a silicon film, on one surface of a glass substrate (i.e., deposition or film formation), thereby forming a thin-film layer (having a thickness of several hundred nm to several tens of μm, for example) on the one surface of the glass substrate; and performing patterning on the thin-film layer. Hereinafter, a description is given by taking the substrate of such a thin-film solar cell as one example. (The substrate may hereinafter be simply referred to as a "workpiece".)

For example, as shown in FIGS. 8A to 8G, a process of manufacturing a thin-film solar cell substrate includes: forming, on the upper surface of a glass substrate 110 (FIG. 8A), a transparent electrode layer (thin-film layer) 111 (FIG. 8B); and performing patterning on the transparent electrode layer 111 by irradiating the transparent electrode layer 111 with a laser beam 115 emitted from a laser machining device, thereby removing part of the transparent electrode layer 111 to form straight machining lines 112A in the transparent electrode layer 111 (FIG. 8C). The substrate 110, including the transparent electrode layer 111 in which the machining lines 112A have been formed, is further processed such that a photoelectric conversion layer (thin-film layer) 113 is formed on the upper surface of the transparent electrode layer 111 (FIG. 8D), and patterning is performed on the photoelectric conversion layer 113 by irradiating the photoelectric conversion layer 113 with the laser beam 115 emitted from the laser machining device, thereby forming machining lines 112B in the photoelectric conversion layer 113 (FIG. 8E). Thereafter, the substrate 110, including the photoelectric conversion layer 113 in which the machining lines 112B have been formed, is further processed such that a back surface electrode layer (thin-film layer) 114 is formed on the upper surface of the photoelectric conversion layer 113 (FIG. 8F). Then, patterning is performed on the back surface electrode layer 114 by irradiating the back surface electrode layer 114 with the laser beam 115 emitted from the laser machining device, thereby forming machining lines 112C in the back surface electrode layer 114 (FIG. 8G). The substrate 110, on which the pattering has been thus performed, is completed as a solar cell module.

FIG. 9 shows a laser machining device 100 of this kind. For example, as shown in FIG. 9, a laser beam 102 (which may hereinafter be simply referred to as a "beam") emitted from a laser oscillator 101 is split into a plurality of beams of light by a beam splitter 103, and the directions of the respective beams of light are changed by corresponding light-guiding mirrors 104, such that the beams are directed toward a workpiece 106. The focal lengths of the respective beams 102 are adjusted by corresponding beam condensing lenses 105, such that the beams 102 focus on a thin-film layer 107 of the workpiece 106. As a result of the thin-film layer 107 being irradiated with the beams 102, the thin-film layer 107 is partially removed, and thus machining lines 108 are formed.

The above-described patterning by the laser machining device 100 is performed in the following manner: fixing the workpiece 106 on a table of a workpiece feeder 109; feeding the workpiece 106 in an X direction and irradiating the workpiece 106 with the laser beams 102, thereby forming machining lines 108 in the workpiece 106; then feeding the workpiece 106 in a Y-direction by a predetermined amount (corresponding to the pitches of the machining lines); and thereafter, feeding the workpiece 106 in the reverse X direction and irradiating the workpiece 106 with the laser beams 102, thereby forming machining lines 108. By repeating this work, the machining lines 108 are formed in the workpiece 106 sequentially. That is, the work of feeding the workpiece 106 in the X direction and forming the machining lines 108, and the work of feeding the workpiece 106 in the Y-direction, are repeated intermittently.

One example of this kind of conventional technology is as follows: splitting a laser beam emitted from a laser oscillator into a plurality of laser beams by using mirrors; and irradiating a thin-film layer of a solar cell with the laser beams via condensing lenses, thereby forming machining lines (see Patent Literature 1, for example).

In another example of conventional technology, a laser beam whose cross section is in the shape of a thin line is generated by a cylindrical lens, and such laser beams each having the thin-line cross section are emitted in a partially overlapping manner to form a continuous machining mark in the shape of a thin line. In this manner, it is intended to increase the conveyance speed of a substrate, thereby reducing the takt time of the laser machining (see Patent Literature 2, for example).

CITATION LIST

Patent Literature

PTL 1: Japanese Laid-Open Patent Application Publication No. 2004-170455
PTL 2: Japanese Laid-Open Patent Application Publication No. 2010-221274

SUMMARY OF INVENTION

Technical Problem

In recent years, electric power generation utilizing natural energy has been drawing increasing attention, and attempts have been made to further promote the use of solar cells by reducing their cost through productivity improvement and the like. Therefore, the takt time of a solar cell production process (i.e., a work time per production process) needs to be further reduced (i.e., faster production is required).

However, in the above-described case where laser machining is performed with the entire surface of the workpiece 106 fixed on the table of the workpiece feeder 109, the workpiece 106 is moved in conveyance directions many times in a reciprocating manner during the machining. Therefore, until the machining on one workpiece 106 is completed, the workpiece 106 cannot be transferred to the next process step. Thus, the machining is time-consuming and inefficient.

Moreover, since the machining is performed with the plurality of beams 102, which are obtained by splitting and separating the laser beam 102 emitted from the laser oscillator 101 into a plurality of beams, variation in beam quality tends to occur among the plurality of beams 102, causing unstable machining quality. If it is attempted to install a plurality of laser oscillators 101 so that a plurality of stable beams can be used, then a large installation space is necessary and the cost of the laser machining device 100 increases.

These problems in the laser machining device 100, such as a long machining time and high cost, are obstacles for reducing the cost of solar cells. It should be noted that the above-described invention disclosed in Patent Literature 1 also has the same problems.

Furthermore, the above-described machining time reduction by the conventional technology disclosed in Patent Literature 2 is realized based on the beam length in the machining direction. Therefore, the reduction in the machining time is limited. Improvement in machining efficiency based on further reduction in the machining time is sought after.

Solution to Problem

In view of the above, an object of the present invention is to provide a laser machining device for use in patterning capable of forming machining lines in a thin-film layer of a workpiece highly efficiently while feeding the workpiece at a predetermined speed.

In order to achieve the aforementioned object, the present invention provides a laser machining device for use in patterning, which is configured to form a machining line in a thin-film layer formed on a workpiece by using a laser beam. The laser machining device includes: a constant-speed feeder configured to feed the workpiece in a single feeding direction at a predetermined feeding speed; a beam head unit including a plurality of beam heads, each beam head being configured to scan a single laser beam on the thin-film layer of the workpiece from an irradiation start side toward an irradiation end side in a direction crossing the feeding direction of the workpiece while either the workpiece is being fed by the constant-speed feeder at the predetermined feeding speed or the workpiece is being fed by the constant-speed feeder and the feeding speed of the workpiece is being detected; a laser oscillator configured to emit the laser beam to irradiate each beam head with the laser beam; and a controller configured to control a scanning speed of the laser beam emitted from each beam head and the feeding speed of the workpiece in relation to each other to control the machining line formed in the workpiece fed at the predetermined feeding speed. The controller is configured to switch a beam head or beam heads to use to form the machining line or machining lines among the plurality of beam heads to form the machining line alternately or the machining lines concurrently.

According to the above configuration, the single laser beam from the beam head unit can be scanned over the thin-film layer of the workpiece while the workpiece is being fed in such a manner that the workpiece is supported at a precise position, and thereby a machining line can be formed in a direction crossing the feeding direction of the workpiece. This makes it possible to form machining lines highly efficiently in the thin-film layer of the workpiece. Moreover, by switching the beam head(s) to use among the plurality of beam heads, the workpiece can be irradiated with the laser beam substantially continuously and efficiently, and thereby the machining lines are formed. This makes it possible to reduce the takt time of a solar cell production process, thereby improving the production efficiency. Furthermore, a method in which the speed of the workpiece is detected and feedback control is performed to adjust the timing of the laser beam scanning may be used, which makes it possible to perform the machining on a continuous workpiece, such as one used in a roll-to-roll process.

The laser machining device may include a switching unit configured to switch the beam head that is to be irradiated with the laser beam emitted from the laser oscillator among the plurality of beam heads. The beam head unit may be configured as a reciprocating motion system, in which while at least one of the beam heads is moving from the irradiation start side toward the irradiation end side and performing laser machining, at least one of the beam heads is returned to the irradiation start side. The controller may be configured to cause the switching unit to perform switching such that the beam head that performs the laser machining is irradiated with the laser beam.

According to this configuration, while a laser machining operation is being performed by using one of the beam heads, the other beam head or beam heads are returned to the irradiation start side. In this manner, a time during which the laser machining is stopped temporarily can be made very short, and thereby the takt time of the laser machining can be reduced.

The laser machining device may include a shutting device configured to prevent each beam head from being irradiated with the laser beam emitted from the laser oscillator. The beam head unit may be configured as a circulating system, in which while at least one of the beam heads is moving from the irradiation start side toward the irradiation end side and performing laser machining, at least one of the beam heads is returned to the irradiation start side. The controller may be configured to control the shutting device such that the beam head that performs the laser machining is irradiated with the laser beam.

According to this configuration, while a laser machining operation is being performed by using one of the beam heads, the other beam head or beam heads are returned to the irradiation start side. In this manner, a time during which the laser machining is stopped temporarily can be made very short, and thereby the takt time of the laser machining can be reduced.

The beam head unit may include a circulating mechanism configured to cause the plurality of beam heads to circulate horizontally or vertically.

According to this configuration, the beam heads are caused to circulate horizontally or vertically in accordance with usage conditions and the like, and while laser machining is being performed from the irradiation start side toward the irradiation end side by using one of the beam heads, the other beam head or beam heads are returned from the irradiation end side toward the irradiation start side. This makes it possible to perform the laser machining substantially continuously, and thereby the laser machining can be performed efficiently, in which the takt time of the laser machining is reduced.

The beam head unit may include an optical path length stabilizing mechanism configured to make constant an optical path length of the laser beam that irradiates the plurality of beam heads.

According to this configuration, the intensity of the laser beam emitted to the workpiece from the beam head that is moved from the irradiation start side toward the irradiation end side can be made constant.

The controller may be configured to determine a scanning position on the workpiece in the feeding direction of the workpiece based on arrangement of the plurality of beam heads, one of the beam heads that performs the laser machining, and the feeding speed of the workpiece.

According to this configuration, the position of scanning on the workpiece by each of the plurality of beam heads is determined by the controller in advance, which makes it possible to perform precise patterning on the workpiece by using the plurality of beam heads.

Advantageous Effects of Invention

According to the present invention, while the workpiece is being fed at the predetermined speed, machining lines can be substantially continuously and efficiently formed in the workpiece in a direction crossing the feeding direction of the workpiece with the single laser beam, and thereby the speed of patterning can be increased significantly.

DESCRIPTION OF EMBODIMENTS

Hereinafter, embodiments of the present invention are described with reference to the drawings. In the description of the embodiments below, a workpiece 5, in which a thin-film layer 6 is formed on a glass substrate 7, is taken as one example.

Figure 1:
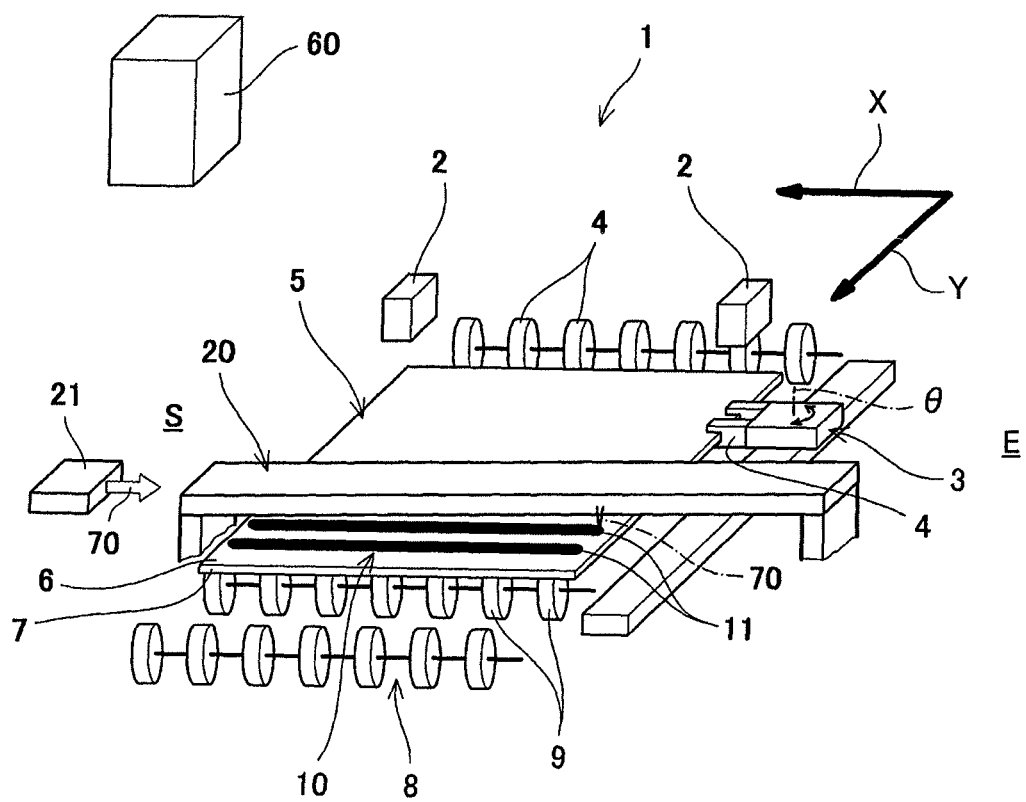
FIG. 1 is a perspective view schematically showing a laser machining device according to the present invention.

As shown in FIG. 1, a laser machining device 1 according to one embodiment of the present invention includes: a camera 2 configured to detect a machining reference position (e.g., an end face) of the workpiece 5; and a constant-speed feeder 3 configured to feed the workpiece 5, on which the position detection has been performed, precisely in a feeding direction (Y-direction, which will hereinafter be referred to as a "feeding direction Y"). In the present embodiment, the constant-speed feeder 3 adopts a workpiece chuck truck system, which is configured to feed the workpiece 5 on rollers 9 of a workpiece support mechanism 8 while holding the workpiece 5 with a workpiece chuck 4.

The constant-speed feeder 3 is configured such that the workpiece chuck 4 is provided with a rotating shaft (θ-axis) rotating in a planar direction and, if necessary, a drive shaft for driving in an X-axis (in a direction crossing the feeding direction) and a drive shaft for driving in a Y-axis (in a direction parallel to the feeding direction). This configuration makes it possible to perform machining while making correction in such a direction as to suppress twisting of the workpiece 5 in synchronization with the feeding by the constant-speed feeder 3. The constant-speed feeder 3 may be configured differently to adopt, for example, a conveyor system or a driving roller conveyor system. In the present embodiment, while the workpiece 5 is being fed by the constant-speed feeder 3, the workpiece 5 is in a state where the thin-film layer 6 faces upward and the glass substrate 7 is supported from below. In the workpiece support mechanism 8, other than the rollers 9, for example, free bearings and a contactless air suction unit (e.g., a drawing mechanism configured to draw the workpiece 5 from below by sucking air) may be used.

A beam head unit 20 configured to perform patterning on the workpiece 5 fed thereto is provided at a predetermined position in the feeding direction of the workpiece 5 fed by the constant-speed feeder 3. The beam head unit 20 is disposed in such a manner as to scan a laser beam 70 in a scanning direction (X-direction, which will hereinafter be referred to as a "scanning direction X") crossing the feeding direction Y of the workpiece 5. The left side in the diagram is an irradiation start side S, and the right side in the diagram is an irradiation end side E. The beam head unit 20 thus disposed at the predetermined position precisely emits the laser beam 70. As a result, machining lines (scribe lines) 11 are precisely formed in the workpiece 5, which is precisely fed by the constant-speed feeder 3. The feeding of the workpiece 5 by the constant-speed feeder 3 and the emission of the laser beam 70 are controlled by a controller 60.

The beam head unit 20 includes a plurality of beam heads 22 and 23 (see FIGS. 3, 4, 6, and 7) each configured to bend the laser beam 70, which is emitted from a laser oscillator 21, to direct the laser beam 70 toward the workpiece 5, thereby irradiating the workpiece 5 with the laser beam 70 to perform patterning. The laser beam 70 from the beam head unit 20, which irradiates the workpiece 5, is a single laser beam 70 emitted from the laser oscillator 21 and directed toward the workpiece 5. The beam head unit 20 will be described in detail below.

It should be noted that a machining part 10, which is provided with the beam head unit 20, includes a workpiece position maintaining mechanism (not shown) configured to support the workpiece 5 at a precise position (elevation) while the workpiece 5 is being fed by the constant-speed feeder 3. For example, a workpiece pushing mechanism configured to push the workpiece 5 from above in a contactless manner by means of an air blower, or push the workpiece 5 by means of pushing rollers or the like, is adopted as the workpiece position maintaining mechanism. By means of the workpiece pushing mechanism and the rollers 9 of the workpiece support mechanism 8, the workpiece 5 is precisely positioned while being fed at the position of the beam head unit 20. These workpiece pushing mechanism and workpiece support mechanism 8 can be realized by known art.

By providing the workpiece support mechanism 8 below the workpiece 5 and providing the workpiece pushing mechanism (not shown) above the workpiece 5 in the above-described manner, the vertical position (elevation) of the workpiece 5 fed in the feeding direction Y in the machining part 10 can be prevented from changing, which makes it possible to prevent the focal point of the laser beam 70, with which to form machining lines 11 in the workpiece 5 while the workpiece 5 is being fed, from varying.

It should be noted that a suction duct (not shown), through which a thin film removed while the machining lines 11 are being formed and vaporized materials are sucked up, may be provided above the workpiece 5. This makes it possible to prevent the removed thin film and the vaporized materials from being re-adhered to, for example, the thin-film layer 6.

Figure 2:
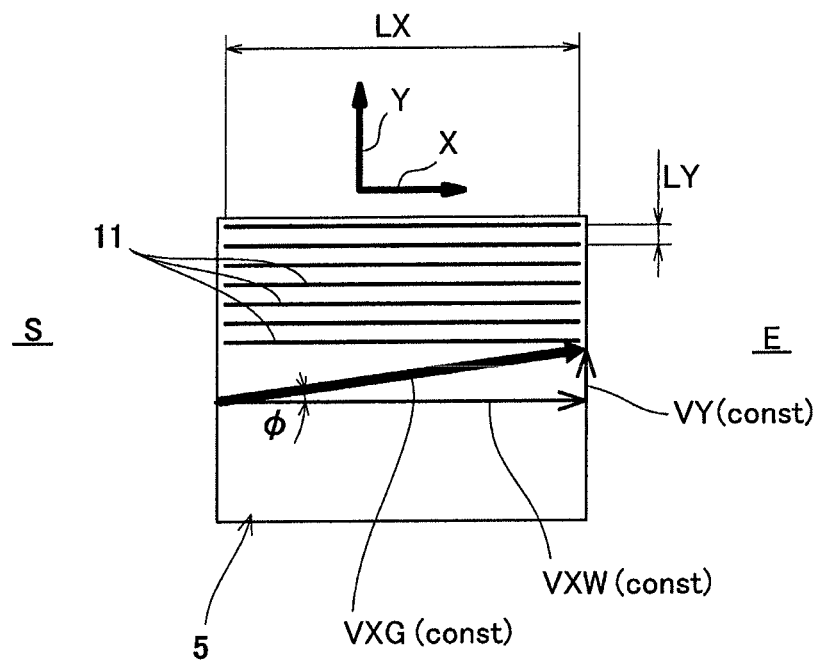
FIG. 2 is a plan view schematically showing machining lines formed by the laser machining device shown in FIG. 1.
Figure 2:
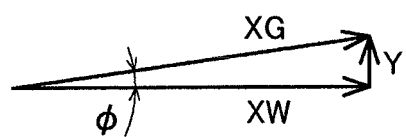

On the other hand, as shown in FIG. 2, in the case of performing patterning by means of the laser machining device 1 by irradiating the workpiece 5 with the laser beam 70 while feeding the workpiece 5 in the workpiece feeding direction Y, the laser scanning position is fixed. In this case, the laser beam 70 is scanned in the scanning direction X from the irradiation start side S toward the irradiation end side E at regular intervals. Patterning is performed with such a laser beam 70 on the workpiece 5 that is being fed at a predetermined speed.

In this case, the controller 60 controls the feeding speed of the workpiece 5 and the scanning speed of the laser beam 70 in relation to each other, such that each machining line 11 formed at the synthetic rate of the scanning speed in the laser beam scanning direction X and the feeding speed in the workpiece feeding direction Y becomes perpendicular to the feeding direction Y.

Specifically, assume that the feeding speed of the workpiece 5 is a "feeding speed VY"; the scanning direction seen from the ground is a "ground scanning direction XG"; the scanning speed with respect to the ground is a "ground scanning speed VXG"; the scanning direction that is the width direction of the workpiece 5 is a "relative scanning direction XW"; the speed of scanning in the width direction of the workpiece 5 is a "relative scanning speed VXW"; and an angle formed between the ground scanning direction XG and the relative scanning direction XW in the horizontal plane is an "inclination angle $\phi$". The sine of the inclination angle $\phi$ can be obtained by dividing the feeding speed VY by the ground scanning speed VXG (sin $\phi$)=VY/VXG). Moreover, the relative scanning speed VXW can be obtained by multiplying the ground scanning speed VXG by the cosine of the inclination angle $\phi$ (VXW=VXG×cos $\phi$). Furthermore, the sine of the inclination angle $\phi$ can be obtained by dividing a distance LY between machining lines 11 in the feeding direction of the workpiece 5 by a length LX of the machining lines 11 in the width direction of the workpiece 5 (tan $\phi$=LY/LX).

Owing to the above relationships, parallel machining lines 11 extending in the relative scanning direction XW and having the predetermined distance LY in between can be continuously formed in the workpiece 5, by scanning the laser beam 70 at the ground scanning speed VXG in the ground scanning direction XG over the workpiece 5 that is being fed at the predetermined feeding speed VY. The controller 60 (FIG. 1) controls the workpiece feeding speed VY and the laser beam scanning speed VXG in relation to each other.

By performing such machining continuously by means of the laser machining device 1, the patterning can be completed by a single feeding of the workpiece 5 in the feeding direction Y. Since the patterning is completed by a single feeding of the workpiece 5 in a single direction, the patterning can be performed not only on the workpiece 5, which has a predetermined length, but also on a continuous workpiece such as one used in a roll-to-roll process.

It should be noted that a flat beam (including, for example, a line beam) may be used as the laser beam 70. In such a case, the machining lines 11 can be formed with a higher machining speed. The irradiation of the flat beam is performed in such a manner that the direction of the flat beam is controlled so that the machining lines 11 are formed perpendicularly to the workpiece feeding direction Y.

Figure 3:
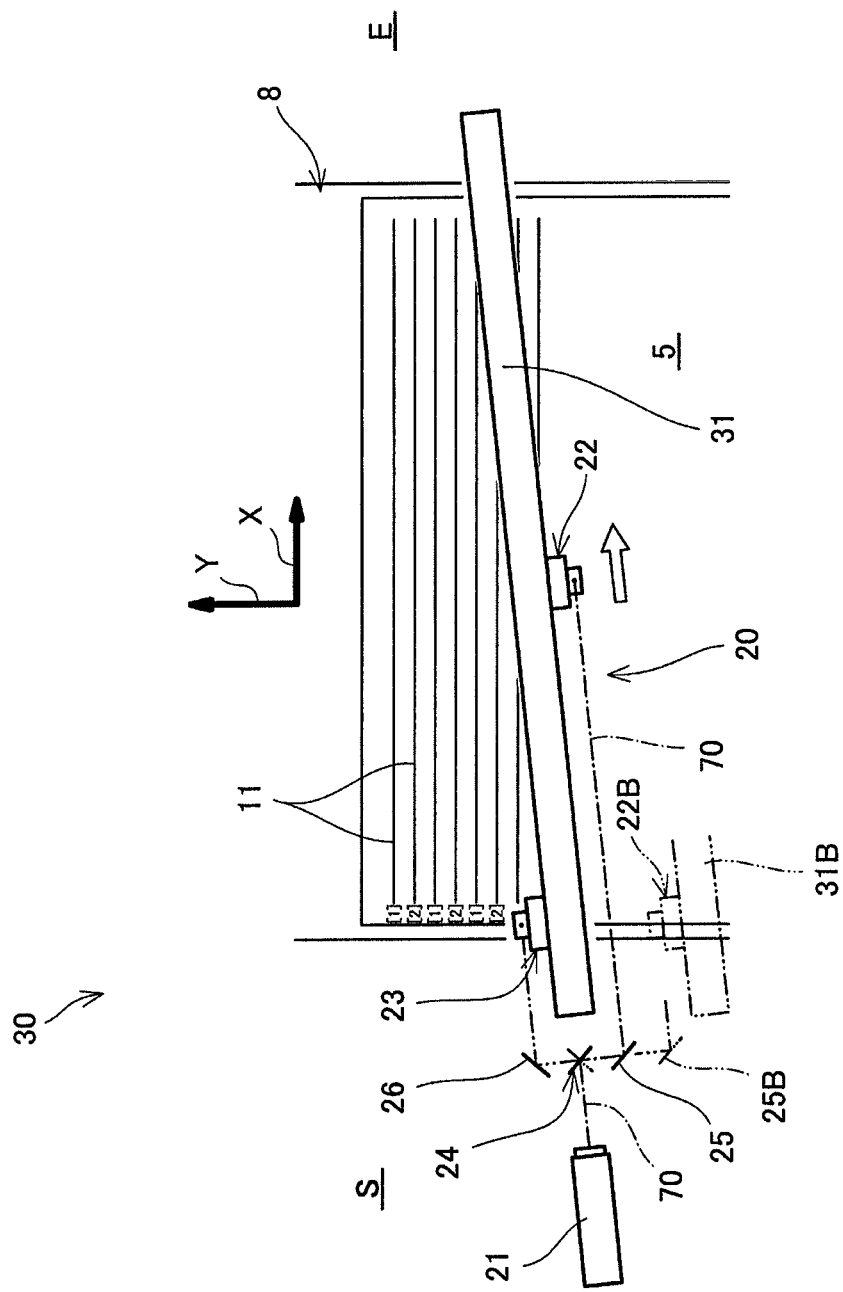
FIG. 3 is a plan view showing the configuration of a laser machining device according to Embodiment 1 of the present invention.
Figure 4:
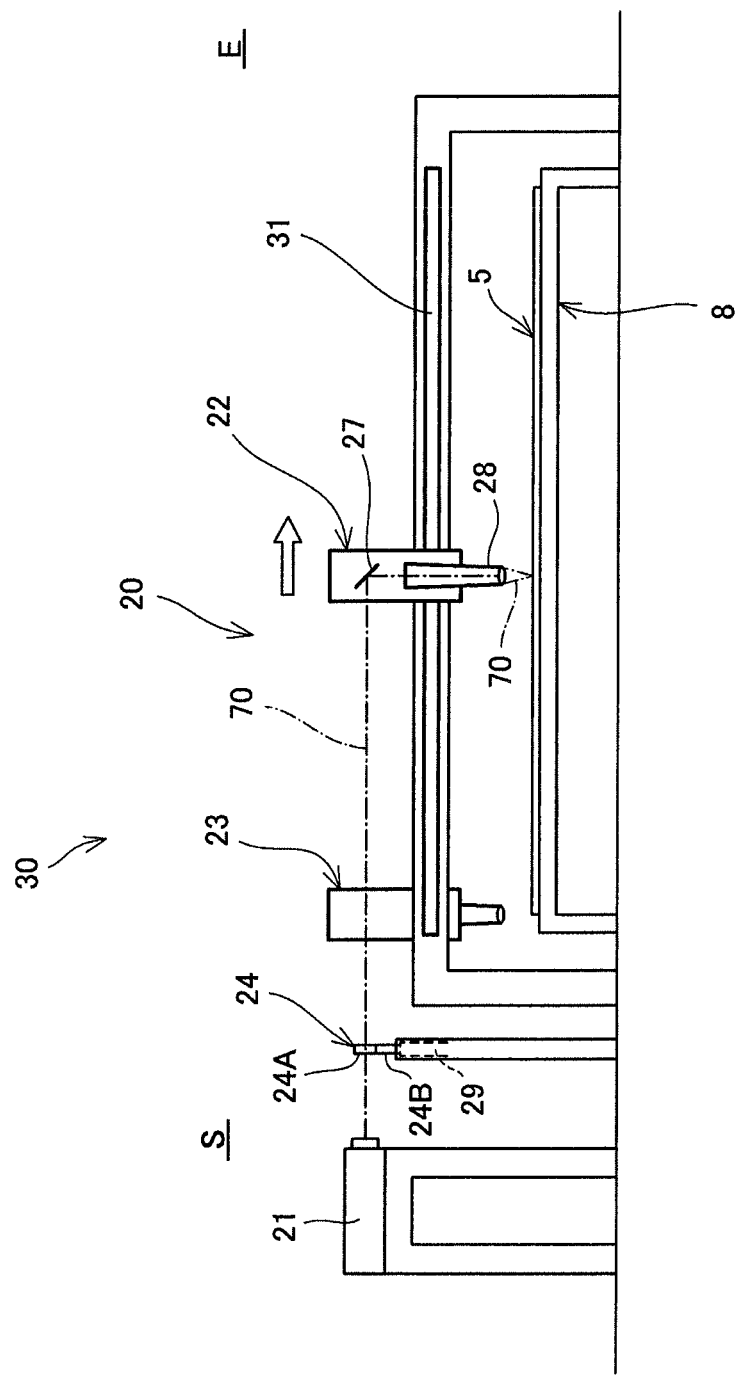
FIG. 4 is a side view of the laser machining device shown in FIG. 3.

Next, with reference to FIG. 3 and FIG. 4, the configuration of a laser machining device according to Embodiment 1 is described. It should be noted that, in the description below, the same components as those shown in FIG. 1 are denoted by the same reference signs as those used in FIG. 1.

A laser machining device 30 serves as an example of a reciprocating motion system, in which the plurality of beam heads 22 and 23 move between the irradiation start side S and the irradiation end side E in a reciprocating manner. The present embodiment includes the two beam heads 22 and 23, and adopts a parallel motion system, in which the first beam head 22 and the second beam head 23 move in a reciprocating manner in the opposite directions to each other.

As shown in FIG. 3, above the workpiece 5 conveyed by the constant-speed feeder 3, a rail 31 is provided, which extends in the scanning direction X crossing the feeding direction Y of the workpiece 5. On both sides of the rail 31, the first beam head 22 and the second beam head 23 are provided, respectively, and are configured to move between the irradiation start side S and the irradiation end side E in a reciprocating manner. As a configuration for causing the beam heads 22 and 23 to move in such a reciprocating manner, for example, a constant-speed driving mechanism or the like may be adopted, in which the beam heads 22 and 23 are guided by a linear motion guide (not shown) provided along the rail 31 and are driven by a driving motor or the like to move between the irradiation start side S and the irradiation end side E in a reciprocating manner. A different configuration may be adopted as the configuration for causing the beam heads 22 and 23 to move in such a reciprocating manner.

The laser oscillator 21 is provided at the irradiation start side S of the rail 31. The laser oscillator 21 is disposed in such a manner as to emit the laser beam 70 in a direction parallel to the moving direction of the beam heads 22 and 23. The laser beam 70, which is emitted from the laser oscillator 21, is bent by a first bending mirror 24 perpendicularly. The bent laser beam 70 is then bent by a second bending mirror 25 or 26 perpendicularly, so that the corresponding beam head 22 or 23 is irradiated with the laser beam 70.

As shown in FIG. 4, the first bending mirror 24 according to the present embodiment includes two bending mirrors 24A and 24B, which are arranged vertically. One bending mirror 24A is disposed in such a manner as to precisely bend and direct the laser beam 70 toward one second bending mirror 25. The other bending mirror 24B is disposed in such a manner as to precisely bend and direct the laser beam 70 toward the other second bending mirror 26.

These bending mirrors 24A and 24B can be integrally moved in the vertical direction, and thereby the bending mirror to use can be switched between the bending mirrors 24A and 24B. A switching unit 29 (e.g., a hydraulic cylinder) is configured to integrally move these bending mirrors 24A and 24B upward and downward. The switching of the first bending mirror 24 is controlled by the controller 60 (FIG. 1).

Although the present embodiment includes the two bending mirrors 24A and 24B and switches the bending mirror to use between the two bending mirrors 24A and 24B, an alternative configuration may be adopted, in which the angle of a single bending mirror 24 is controlled, and thereby the laser beam 70 is precisely bent and directed toward each of the second bending mirrors 25 and 26.

Each of the beam heads 22 and 23 further includes: a third bending mirror 27 configured to bend the laser beam 70 that is horizontally emitted thereto, such that the laser beam 70 is directed downward; and a condensing lens 28 configured to collect the laser beam 70 bent by the third bending mirror 27.

As shown in FIG. 3 and FIG. 4, in the case of performing laser machining by means of the first beam head 22, the laser beam 70 bent by the first bending mirror 24A is bent the second bending mirror 25 to be directed in the scanning direction of the first beam head 22, such that the first beam head 22 is irradiated with the laser beam 70. The laser beam 70 that irradiates the first beam head 22 is bent by the third bending mirror 27 provided in the first beam head 22, and thereby directed toward the workpiece 5. Then, the laser beam 70 is emitted from the condensing lens 28 toward the workpiece 5. The laser beam 70 forms a machining line 11 in the workpiece 5.

In the case of performing laser machining by means of the second beam head 23, which is provided on the opposite side surface of the rail 31 to the first beam head 22, the switching unit 29 switches the first bending mirror 24 from the bending mirror 24A to the bending mirror 24B, and thereby the laser beam 70 is bent and directed toward the second bending mirror 26. The laser beam 70 directed toward the second bending mirror 26 is bent by the second bending mirror 26, and then irradiates the second beam head 23. The laser beam 70 that irradiates the second beam head 23 is, similar to the case of the first beam head 22, bent by the third bending mirror 27 provided in the second beam head 23, and thereby directed toward the workpiece 5. Then, the laser beam 70 is emitted from the condensing lens 28 toward the workpiece 5. The laser beam 70 forms a machining line 11 in the workpiece 5.

Although Embodiment 1 describes an example that includes the two beam heads 22 and 23, if Embodiment 1 includes three or more beam heads, then as shown in FIG. 3 by two-dot chain line, rails 31 may be arranged in parallel to each other in the workpiece feeding direction Y, and a rail 31B of the rails 31 may include a third beam head 22B (and a fourth beam head if necessary (not shown)). In this case, the second bending mirror 25, which is positioned at a side where the rail 31B is additionally provided, may be configured to be movable vertically. At the time of performing laser machining by means of the third beam head 22B, the second bending mirror 25 may be lowered to allow the laser beam 70 to pass through, and the laser beam 70 may be bent by an additionally provided second bending mirror 25B to be directed toward the third beam head 22B.

In the case of including three or more beam heads, the machining that is performed by alternately switching the beam head to use among the plurality of beam heads may be combined with machining that uses some of the plurality of beam heads concurrently. In this manner, the machining time can be further reduced.

Figure 5:
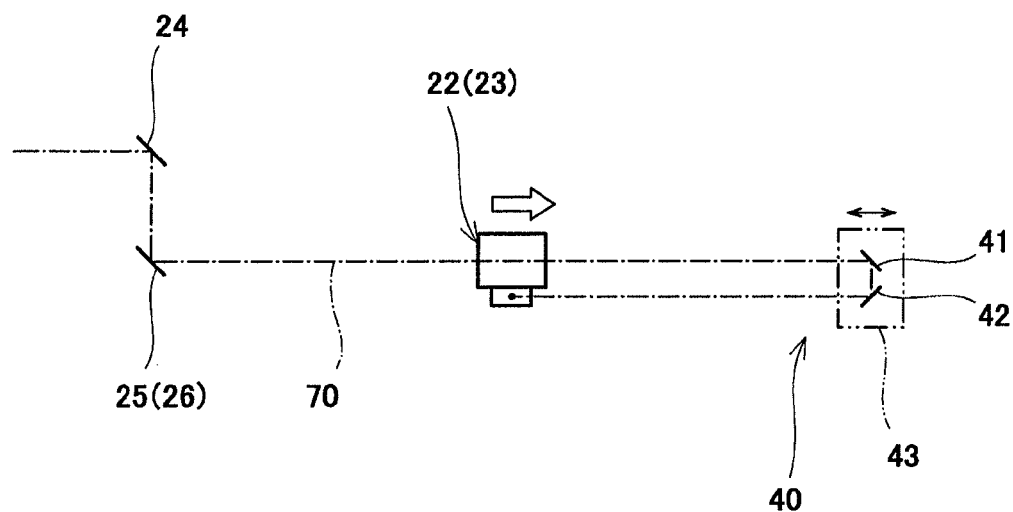
FIG. 5 is a schematic diagram showing an optical path length stabilizer included in the laser machining device shown in FIG. 3.

When the beam head 22 or 23 is moved in the above-described manner, its distance from the laser oscillator 21 changes, causing a change in the beam intensity. Therefore, as shown in FIG. 5, an optical path length stabilizer 40 may be provided, which allows the laser beam 70 to irradiate the beam heads 22 and 23 with the same optical path length regardless of the amount of movement of the beam heads 22 and 23. In FIG. 5, the first beam head 22 is taken as an example.

The optical path length stabilizer 40 shown in FIG. 5 is configured to cause the laser beam 70 bent by the second bending mirror 25 (26) to irradiate the beam head 22 (23) through a reflecting mirror unit 43. The reflecting mirror unit 43 includes fourth and fifth bending mirrors 41 and 42, which are provided forward from the beam head 22 (23) in the moving direction of the beam head 22 (23). The fourth and fifth bending mirrors 41 and 42 of the optical path length stabilizer 40 are provided in such a manner as to deflect the laser beam 70 from the second bending mirror 25 (26) by 180°, such that the laser beam 70 is directed in the opposite direction. The optical path length stabilizer 40 is configured to move the reflecting mirror unit 43 by a distance that is half of the moving amount of the beam head 22 (23).

According to the above-described optical path length stabilizer 40, by moving the reflecting mirror unit 43 in the same direction as the moving direction of the beam head 22 (23) by a moving amount that is half of the moving amount of the beam head 22 (23), the beam head 22 (23) can be irradiated with the laser beam 70 whose optical path length is kept constant. The optical path length stabilizer 40 described above is merely one example. The optical path length of the laser beam 70 may be kept constant by using a different configuration, such as one using a link mechanism or optical fiber.

According to the above-described laser machining device 1 of Embodiment 1, since the beam head unit 20 includes the plurality of beam heads 22 and 23, while one beam head 22 (23) is performing laser machining, the other beam head 23 (22) can be moved to the irradiation start side S. Accordingly, by moving both the beam heads 22 and 23 in opposite directions to each other at the same speed, when one beam head 22 (23) reaches a machining end position, the other beam head 23 (22) can be positioned at a machining start position.

Therefore, by performing laser machining by using the beam heads 22 and 23 alternately, the laser machining can be performed in a substantially continuous manner. For example, machining lines 11 indicated by [1] in FIG. 3 are fixated by machining using the first beam head 22, and machining lines 11 indicated by [2] in FIG. 3 are formed by machining using the second beam head 23. By repeating the machining using the first beam head 22 and the machining using the second beam head 23 alternately, substantially continuous laser machining can be performed. Accordingly, such substantially continuous laser machining can be efficiently performed by moving the beam heads 22 and 23 at a speed of, for example, 10 to 20 m/sec.

Therefore, by forming machining lines 11 while feeding the workpiece 5 in the single feeding direction Y, the takt time of the machining line forming work can be reduced significantly, and thereby the productivity of solar cells or the like can be improved significantly, which also makes it possible to lower the cost of the solar cells and promote the use of the solar cells.

Figure 6:
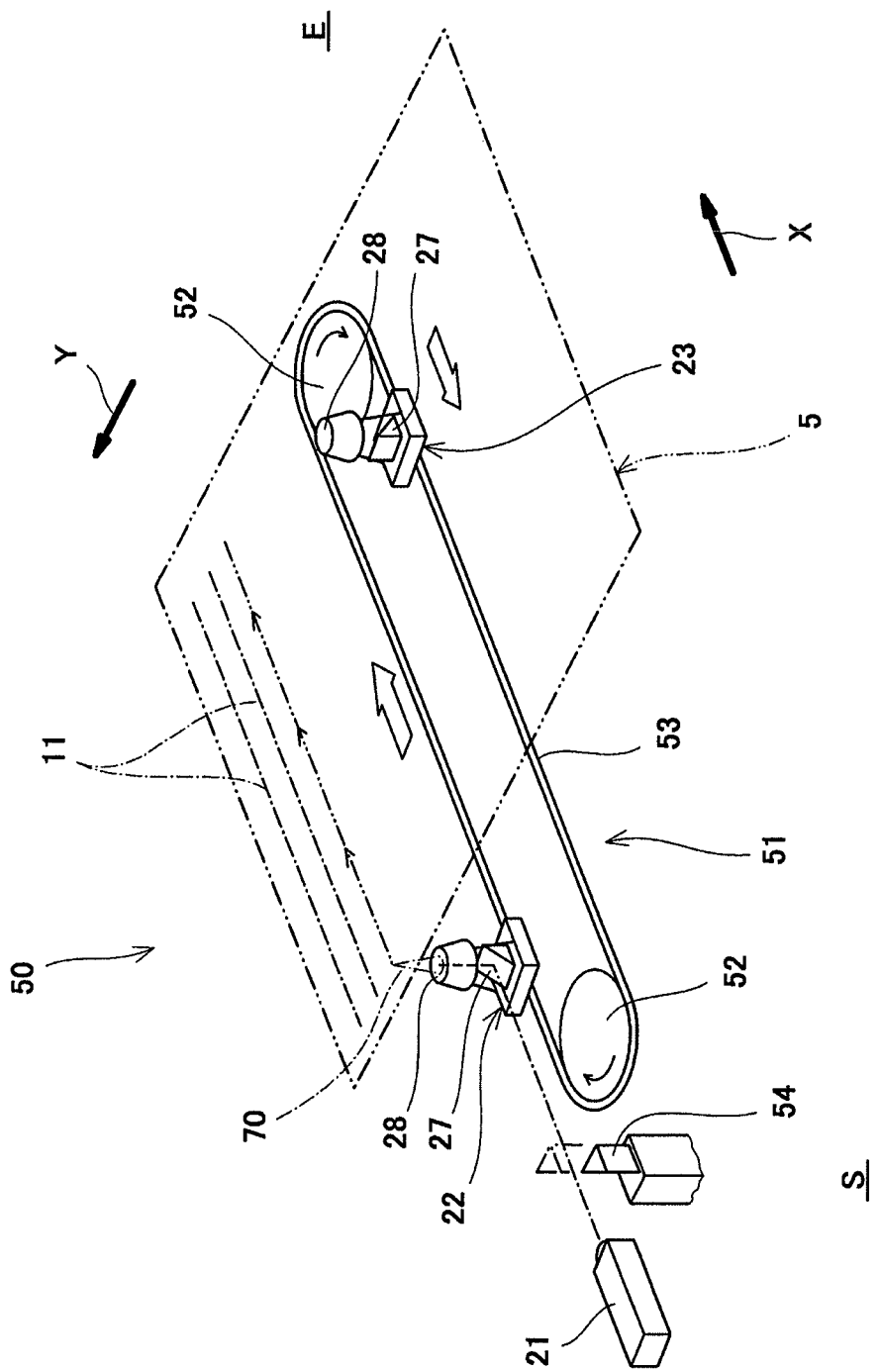
FIG. 6 is a perspective view showing the configuration of a laser machining device according to Embodiment 2 of the present invention.

FIG. 6 shows an essential part of a laser machining device 50 according to Embodiment 2. The laser machining device 50 according to Embodiment 2 serves as an example of a circulating system, in which the plurality of beam heads are caused to circulate between the irradiation start side S and the irradiation end side E. That is, in this example, the plurality of beam heads are moved to circulate in the same direction, i.e., a return system. It should be noted that the present embodiment describes a configuration in relation to a beam head unit 51. In the description below, the same components as those shown in FIG. 3 and FIG. 4 are denoted by the same reference signs as those used in FIG. 3 and FIG. 4. In Embodiment 2, an example where the beam head unit 51 is disposed below the workpiece 5 is described.

As shown in FIG. 6, the laser machining device 50 according to the present embodiment also includes two beam heads 22 and 23. These beam heads 22 and 23 are, other than their drive system, the same as the above-described beam heads 22 and 23 shown in FIG. 3 and FIG. 4 in terms of configuration.

In the present embodiment, the beam heads 22 and 23 are moved between the irradiation start side S and the irradiation end side E by a timing belt 53 driven by timing pulleys 52, and are caused to turn horizontally at both ends, thereby moving in a circulating manner.

As shown in FIG. 6, the laser oscillator 21 is disposed on the extension of one side of the timing belt 53, the one side moving from the irradiation start side S toward the irradiation end side E (i.e., disposed on the left side in FIG. 6). The laser oscillator 21 is disposed in such a manner as to emit the laser beam 70 precisely toward the beam head 22 (23) that is moving from the irradiation start side S toward the irradiation end side E.

In addition, a beam shutter 54 is provided between the laser oscillator 21 and the beam heads 22 and 23. The beam shutter 54 is configured to shut off the laser beam 70 for a predetermined time while the beam heads 22 and 23 are turning at the ends. For example, an electrical shutter or a mechanical shutter is used as the beam shutter 54. The beam shutter 54 is controlled such that while the beam heads 22 and 23, which circulate at a predetermined speed, are in a predetermined range of movement in the laser beam scanning direction X, the beam shutter 54 allows the beam heads 22 and 23 to be irradiated with the laser beam 70 emitted from the laser oscillator 21, and thereby laser machining is performed. The opening and closing of the beam shutter 54 are controlled based on, for example, information about stepping motors or the like that drive the timing pulleys 52.

Although the beam heads 22 and 23 are the same as those shown in FIG. 3 and FIG. 4, the present embodiment gives an example in which the beam heads 22 and 23 are provided below the workpiece 5, and the laser beam 70 is emitted upward from the beam heads 22 and 23. The laser beam 70 emitted from the laser oscillator 21 is bent by the third bending mirror 27 of the beam head 22 (23) to be directed toward the workpiece 5. Then, the laser beam 70 is emitted from the condensing lens 28 toward the workpiece 5.

In the case of the laser machining device 50 according to Embodiment 2, while laser machining is being performed from the irradiation start side S by means of one beam head 22 (23), the other beam head 23 (22) can be moved from the irradiation end side E toward the irradiation start side S.

Figure 7:
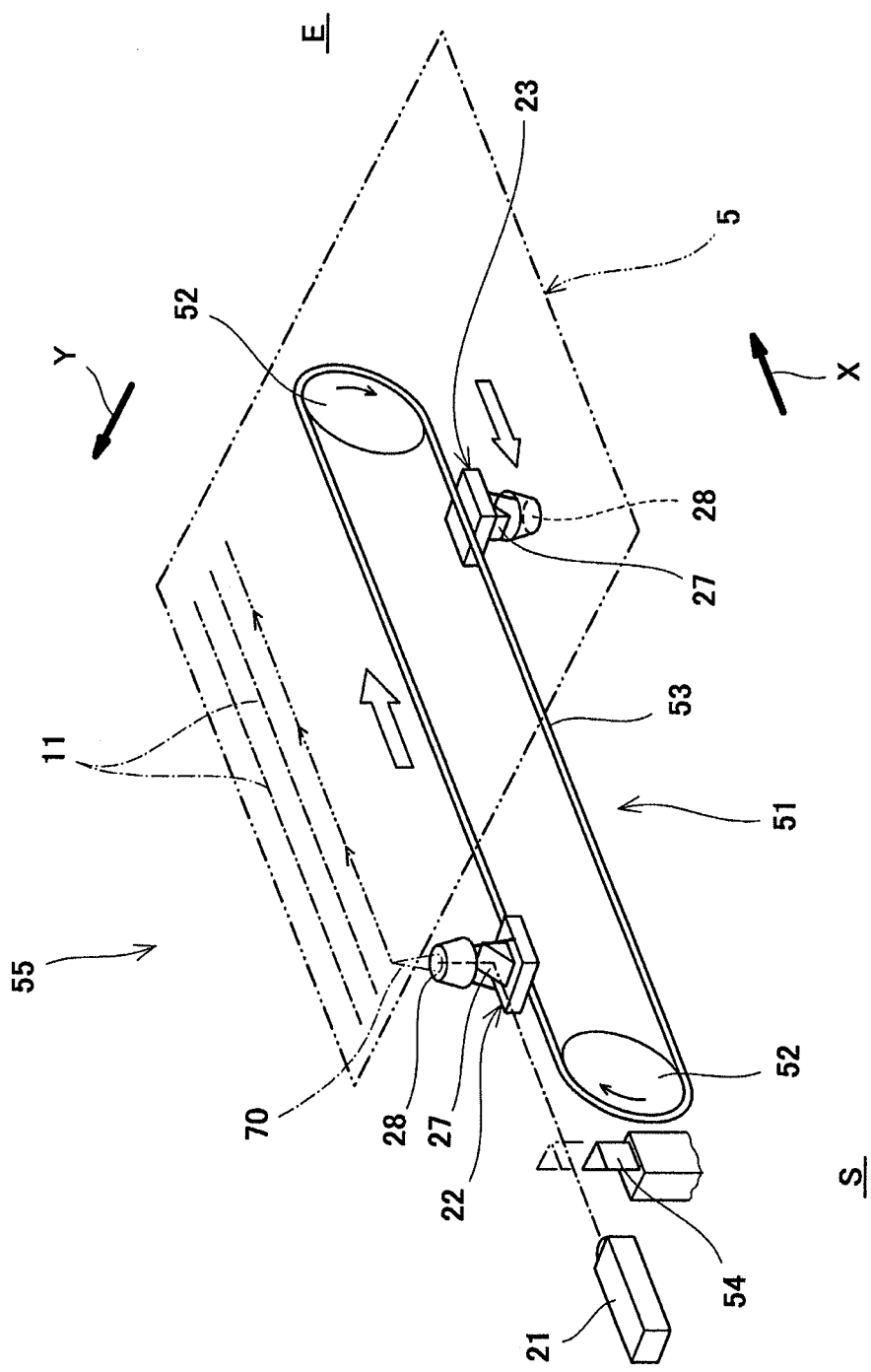
FIG. 7 is a perspective view showing the configuration of a laser machining device according to Embodiment 3 of the present invention.
Figure 8A:
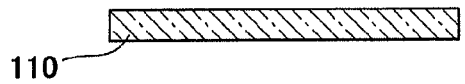
FIG. 8A is a sectional side view showing a step in the manufacturing of a thin-film solar cell by a laser machining device.
Figure 8B:
FIG. 8B is a sectional side view showing a step in the manufacturing of the thin-film solar cell, following the step shown in FIG. 8A.
Figure 8C:
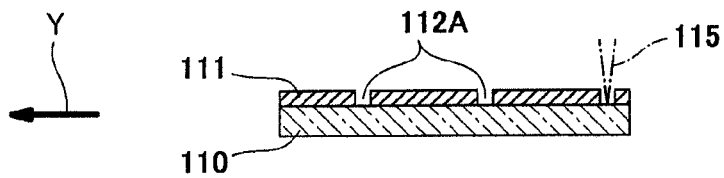
FIG. 8C is a sectional side view showing a step in the manufacturing of the thin-film solar cell, following the step shown in FIG. 8B.
Figure 8D:
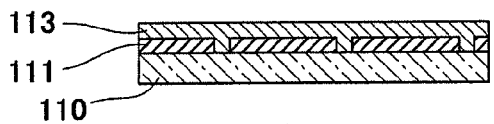
FIG. 8D is a sectional side view showing a step in the manufacturing of the thin-film solar cell, following the step shown in FIG. 8C.
Figure 8E:
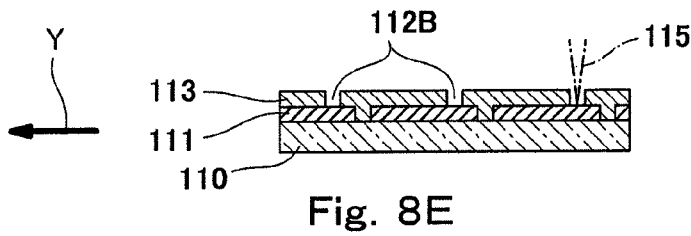
FIG. 8E is a sectional side view showing a step in the manufacturing of the thin-film solar cell, following the step shown in FIG. 8D.
Figure 8F:
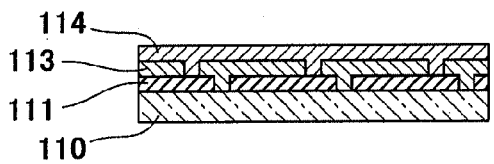
FIG. 8F is a sectional side view showing a step in the manufacturing of the thin-film solar cell, following the step shown in FIG. 8E.
Figure 8G:
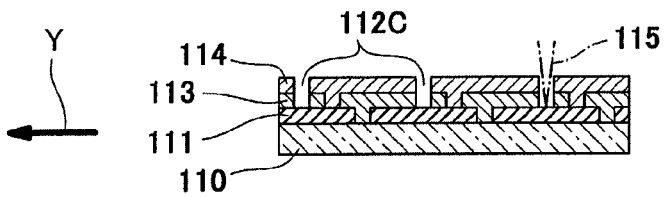
FIG. 8G is a sectional side view showing a step in the manufacturing of the thin-film solar cell, following the step shown in FIG. 8F.
Figure 9:
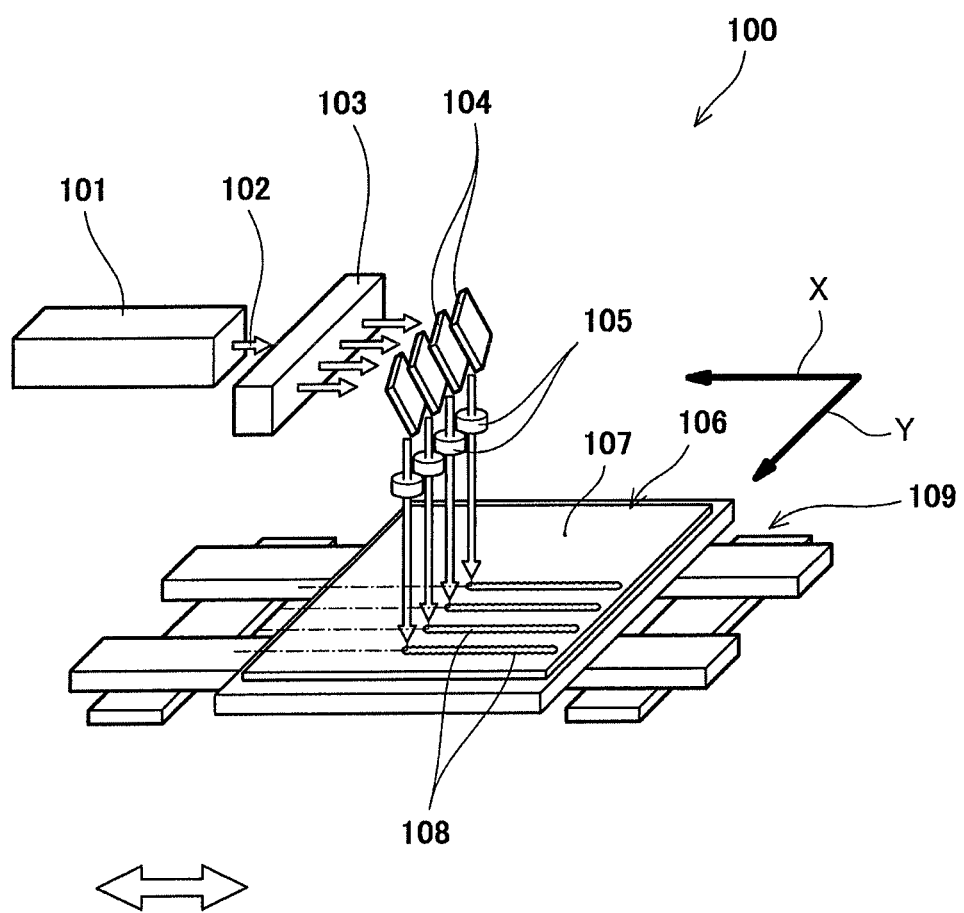
FIG. 9 is a perspective view schematically showing a conventional laser machining device.

FIG. 7 shows a laser machining device 55 according to Embodiment 3, which is a variation of the above-described laser machining device 50 of Embodiment 2 shown in FIG. 6. In the description below, the same components as those of Embodiment 2 shown in FIG. 6 are denoted by the same reference signs as those used in FIG. 6, and the description of such components is omitted.

The laser machining device 55 according to the present embodiment is configured such that the beam heads 22 and 23 are moved between the irradiation start side S and the irradiation end side E, and are caused to turn vertically at both ends, thereby moving in a circulating manner. Also in the present embodiment, the laser oscillator 21 is disposed on the extension of one side of the timing belt 53, the one side moving from the irradiation start side S toward the irradiation end side E (i.e., disposed on the left side in FIG. 7). The laser oscillator 21 is disposed in such a manner as to emit the laser beam 70 toward the beam head 22 or 23 that is moving from the irradiation start side S toward the irradiation end side E.

Also in the present embodiment, the shutter 54, which is configured to shut off the laser beam 70 while the beam head 22 (23) is turning at the end, is provided between the laser oscillator 21 and the beam head 22 (23). The other features of Embodiment 3 are the same as Embodiment 2. Therefore, the description of such common features is omitted below.

Also in the case of the laser machining device 55 according to Embodiment 3, while laser machining is being performed from the irradiation start side S by means of one beam head 22 (23), the other beam head 23 (22) can be moved from the irradiation end side E toward the irradiation start side S.

It should be noted that Embodiment 2 or 3 may additionally include an optical path length stabilizer. In such a case, not the above-described optical path length stabilizer 40 but, for example, an optical path length stabilizer using a link mechanism is adopted.

In the case of irradiating the workpiece 5 with the laser beam 70 from below as in Embodiments 2 and 3, the laser beam 70 irradiates the workpiece 5 such that the laser beam 70 is transmitted through the glass substrate 7 of the workpiece 5 and focuses at the thin-film layer 6, which is formed on the upper surface of the workpiece 5.

Also according to the above-described laser machining devices 50 and 55 of Embodiments 2 and 3, since the beam head unit 51 includes the plurality of beam heads 22 and 23, while one beam head 22 (23) is performing laser machining from the irradiation start side S toward the irradiation end side E, the other beam head 23 (22) can be moved toward the irradiation start side S. This makes it possible to efficiently perform substantially continuous laser machining.

Therefore, by forming machining lines 11 while feeding the workpiece 5 in the single feeding direction Y, the takt time of the machining line forming work can be reduced significantly, and thereby the productivity of solar cells or the like can be improved significantly, which also makes it possible to lower the cost of the solar cells and promote the use of the solar cells.

As described above, according to the laser machining devices 1, 50, and 55, while the workpiece 5 is being fed in the feeding direction Y at a constant speed continuously (or intermittently at regular intervals), the laser beam 70 is scanned at a predetermined scanning speed in the scanning direction X crossing the feeding direction Y. The feeding speed of the workpiece 5 and the scanning speed of the laser beam 70 are controlled in relation to each other by the controller 60, such that the machining lines 11 formed by the single laser beam 70 become perpendicular to the feeding direction Y of the workpiece 5. In this manner, high-speed patterning can be performed on the thin-film layer 6. Since the laser machining is completed by a single feeding of the workpiece 5 in the feeding direction Y at a predetermined feeding speed, the machining on the single workpiece 5 can be completed within a short period of time.

In addition, since the laser machining is completed by forming the machining lines 11 by scanning the laser beam 70 while feeding the workpiece 5 in a single direction, the high-speed continuous machining can be performed not only on the workpiece 5 of each separate substrate, but also on a continuous workpiece, such as one used in a roll-to-roll process for manufacturing flexible solar cells.

Moreover, in a case where machining lines 11 are formed in a plurality of film-formed layers as shown in FIG. 8A to FIG. 8G a plurality of the above-described laser machining devices 1 and a plurality of film forming devices (not shown) may be arranged in parallel to each other in the feeding direction. This makes it possible to continuously perform the patterning while conveying the workpiece 5 in a single direction. As a result, the takt time of the patterning can be reduced significantly, and thereby the productivity of solar cells or the like can be improved significantly, which also makes it possible to lower the cost of the solar cells and promote the use of the solar cells.

Furthermore, the laser machining device 1, which is capable of fabricating solar cells with stable machining quality, can be manufactured at low cost since the laser machining device 1 does not use multiple beams that are obtained by installing a beam splitting/separating device or multiple oscillators.

Although the above-described embodiments have given examples where the machining is performed while the workpiece 5 is being continuously fed in the feeding direction Y at a constant speed, the manner of feeding the workpiece 5 is not limited to the above-described examples. The machining may be performed while the workpiece 5 is being intermittently fed at regular intervals in accordance with processing conditions and the like.

Further, in the above-described embodiments, the laser oscillator 21 is configured as a component separate from the beam heads 22 and 23. However, in a case where the laser oscillator 21 is a compact light-weight laser oscillator, the laser oscillator 21 and the beam heads 22 and 23 may be configured to be integrally movable.

Still further, the above-described embodiments merely indicate examples. Various changes may be made without departing from the spirit of the present invention. Thus, the present invention is not limited to the above-described embodiments.

INDUSTRIAL APPLICABILITY

The laser machining device according to the present invention is applicable in the manufacturing process of, for example, thin-film solar cells or flexible solar cells (roll-to-roll process).

REFERENCE SIGNS LIST 1 laser machining device
3 constant-speed feeder
5 workpiece
6 thin-film layer
7 substrate (glass substrate)
11 machining line (scribe line)
20 beam head unit
21 laser oscillator
22 first beam head
23 second beam head
24 first bending mirror
24A, 24B bending mirror
25, 26 second bending mirror
27 third bending mirror
28 condensing lens
29 switching unit
30 laser machining device
31 rail
32 beam scanning unit
40 optical path length stabilizer
41 fourth bending mirror
42 fifth bending mirror
43 reflecting mirror unit
50 laser machining device
51 beam head unit
54 beam shutter
55 laser machining device
60 controller
70 laser beam
S irradiation start side
E irradiation end side
X laser beam scanning direction
Y workpiece feeding direction

The invention claimed is:

1. A laser machining device for use in patterning, which is configured to form a machining line in a thin-film layer formed on a workpiece by using a laser beam, the laser machining device comprising:
    a constant-speed feeder configured to feed the workpiece in a single feeding direction at a predetermined feeding speed;
    a beam head unit including a plurality of beam heads,
        each beam head being configured to scan a single laser beam on the thin-film layer of the workpiece from an irradiation start side toward an irradiation end side in a direction crossing the feeding direction of the workpiece while either the workpiece is being fed by the constant-speed feeder at the predetermined feeding speed or the workpiece is being fed by the constant-speed feeder and the feeding speed of the workpiece is being detected;
    a laser oscillator configured to emit the laser beam to irradiate each beam head with the laser beam; and
    a controller configured to control a scanning speed of the laser beam emitted from each beam head and the feeding speed of the workpiece in relation to each other to control the machining line formed in the workpiece fed at the predetermined feeding speed, wherein
    the controller is configured to switch a beam head or beam heads to use to form the machining line or machining lines among the plurality of beam heads to form the machining line alternately or the machining lines concurrently.

2. The laser machining device for use in patterning according to claim 1, comprising a switching unit configured to switch the beam head that is to be irradiated with the laser beam emitted from the laser oscillator among the plurality of beam heads, wherein
    the beam head unit is configured as a reciprocating motion system, in which while at least one of the beam heads is moving from the irradiation start side toward the irradiation end side and performing laser machining, at least one of the beam heads is returned to the irradiation start side, and the controller is configured to cause the switching unit to perform switching such that the beam head that performs the laser machining is irradiated with the laser beam.

3. The laser machining device for use in patterning according to claim 1, comprising a shutting device configured to prevent each beam head from being irradiated with the laser beam emitted from the laser oscillator, wherein
the beam head unit is configured as a circulating system, in which while at least one of the beam heads is moving from the irradiation start side toward the irradiation end side and performing laser machining, at least one of the beam heads is returned to the irradiation start side, and
the controller is configured to control the shutting device such that the beam head that performs the laser machining is irradiated with the laser beam.

4. The laser machining device for use in patterning according to claim 3, wherein
the beam head unit includes a circulating mechanism configured to cause the plurality of beam heads to circulate horizontally or vertically.

5. The laser machining device for use in patterning according to claim 2, wherein the beam head unit includes an optical path length stabilizing mechanism configured to make constant an optical path length of the laser beam that irradiates the plurality of beam heads.

6. The laser machining device for use in patterning according to claim 5, wherein the controller is configured to determine a scanning position on the workpiece in the feeding direction of the workpiece based on arrangement of the plurality of beam heads, one of the beam heads that performs the laser machining, and the feeding speed of the workpiece.

7. The laser machining device for use in patterning according to claim 3, wherein the beam head unit includes an optical path length stabilizing mechanism configured to make constant an optical path length of the laser beam that irradiates the plurality of beam heads.

* * * * *